United States Patent
Terrovits

(10) Patent No.: US 7,787,227 B1
(45) Date of Patent: Aug. 31, 2010

(54) APPARATUS AND METHOD FOR ELECTROSTATIC DISCHARGE PROTECTION OF A TRANSMIT INTEGRATED CIRCUIT

(75) Inventor: Manolis Terrovits, Berkeley, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 201 days.

(21) Appl. No.: 12/109,240

(22) Filed: Apr. 24, 2008

(51) Int. Cl.
*H02H 3/20* (2006.01)
*H02H 3/22* (2006.01)

(52) U.S. Cl. .................. 361/56; 361/111; 361/91.1

(58) Field of Classification Search ............... 361/56, 361/111, 91.1
See application file for complete search history.

(56) References Cited

U.S. PATENT DOCUMENTS

| 5,311,391 | A * | 5/1994 | Dungan et al. | 361/56 |
| 6,597,227 | B1 | 7/2003 | Yue et al. | |
| 6,661,273 | B1 * | 12/2003 | Lai et al. | 327/310 |
| 6,963,112 | B2 * | 11/2005 | Chen | 257/365 |
| 7,545,614 | B2 * | 6/2009 | Traynor et al. | 361/56 |
| 7,593,204 | B1 * | 9/2009 | Iversen et al. | 361/56 |

* cited by examiner

*Primary Examiner*—Stephen W Jackson
*Assistant Examiner*—Zeev Kitov
(74) *Attorney, Agent, or Firm*—Bever, Hoffman & Harms, LLP; Jeanette S. Harms

(57) ABSTRACT

An apparatus and method for providing electrostatic discharge protection of a transmit integrated circuit including an ESD protect block coupled to an integrated circuit pad in a package without bond wires, and an ESD clamp circuit coupled between the ESD protect block and ground. During transmission, one or more capacitors within the ESD protect block may charge up to various levels near the peak transmit voltage, which reverse biases one or more diodes in the ESD protect block, thereby buffering the transmit circuit from the capacitive load of the ESD clamp circuit. The ESD protect block may prevent the ESD clamp circuit from activating due to the high peak voltages output from the transmit circuit. An embodiment of the ESD protect block may apply particularly to transmit power amplifier circuits in which the output signal peaks at twice the supply voltage. In one embodiment applicable for lower voltage CMOS processes, the ESD protect block includes a diode and a capacitor. In another embodiment applicable for higher voltage CMOS processes, the ESD protect block includes two diodes, one or two capacitors, and an optional resistor.

10 Claims, 2 Drawing Sheets

US 7,787,227 B1

APPARATUS AND METHOD FOR ELECTROSTATIC DISCHARGE PROTECTION OF A TRANSMIT INTEGRATED CIRCUIT

BACKGROUND OF THE INVENTION

1. Field of the Invention

Embodiments of the present invention generally relate to electrostatic discharge (ESD) protection, and more particularly to ESD protection of power amplifier integrated circuits.

2. Description of the Related Art

Electrostatic discharge (ESD) occurs when a static charge builds up in a human operator or machine and then through contact produces a large current in an integrated circuit in a short period of time. ESD may damage an unprotected complementary metal oxide semiconductor (CMOS) integrated circuit, and shrinking CMOS process technologies result in structures more susceptible to ESD damage. At the same time, increasing signaling rates of high speed communications systems require strict control of signal distortion to ensure adequate performance. A well designed ESD protection circuit should not alter significantly a transmit signal or a receive signal passing through the node the circuit protects.

A typical ESD clamp circuit shunts the large current generated by the ESD event to ground bypassing the sensitive blocks of the integrated circuit thereby protecting them from the ESD event. Coupling such an ESD clamp circuit directly to an input or output node may provide a large capacitive load to a high frequency input or output signal coupled to the same node, thereby distorting the signal. Intervening circuitry between the ESD clamp circuit and the input or output node may isolate the ESD clamp circuit's capacitance from the high frequency signal.

FIG. 1 illustrates a prior art ESD protected integrated circuit 100 that couples an ESD clamp circuit 102 to a radio frequency output (RF OUT) package pin 104 through a first inductive bond wire $L_{bw}$ 106 between a chip pad 108 and the RF OUT package pin 104. Similarly a high frequency transmit signal output from a power amplifier (PA) 101 is coupled to the RF OUT package pin 104 through a second inductive bond wire $L_{bw}$ 105 coupled between a chip pad 103 and the RF OUT package pin 104. During radio frequency (RF) operation, the bond wire inductors $L_{bw}$ 105 and $L_{bw}$ 106 ensure that the PA 101 output couples to an off-chip impedance matching network (not shown), which couples to the RF OUT package pin 104, thereby shielding the ESD clamp circuit 102 from the high peak voltages of the PA 101 transmit signal. During an ESD event, the low frequency current generated at the RF OUT package pin 104 is absorbed by the ESD clamp circuit 102, thereby protecting the PA 101 from damage by the ESD.

Many different designs exist in the prior art for ESD clamp circuits, which may activate when a voltage at the input to the ESD clamp circuit 102 exceeds a certain level, turning on a clamp transistor circuit within the ESD clamp circuit 102 and thereby shunting excess current due to a voltage differential to ground. The ESD clamp circuit 102 may present a significant capacitive load if connected directly to the PA 101, thereby affecting the performance of the PA 101. The bypass capacitor 107 coupled to the same chip pad as the ESD clamp 102 minimizes the load of the ESD clamp circuit 102 on the PA 101. Packages without bond wires, such as chip scale packages, however, do not use bond wires to couple the chip pads to the package inputs/output nodes. Instead the chip pads couple directly to the package bumps, and as such an alternative ESD protection circuit is required.

FIG. 2 illustrates another prior art ESD protected integrated circuit 200, for a chip packaged without bond wires, in which an ESD clamp circuit 202 couples through an on-chip inductor $L_{oc}$ 204 to an RF OUT chip pad 203 to which a PA 201 output is coupled as well. The ESD clamp circuit 202 may not couple directly to the RF OUT chip pad 203, as its capacitance may load undesirably the PA 201 output signal thereby affecting the PA 201 output signal's transmission characteristics. The on-chip inductor $L_{oc}$ 204 may isolate the PA 201 from the ESD clamp circuit's 202 capacitance, but disadvantageously, the on-chip inductor $L_{oc}$ 204 may require significant chip area to implement. Additionally, the resistance of the on-chip inductor $L_{oc}$ 204 may result in an undesirable voltage drop across the inductor $L_{oc}$ 204 during the ESD event, which may compromise the level of ESD protection. Therefore there is a need for an ESD protection circuit for CMOS IC power amplifiers that ensure high performance signal transmission and adequate ESD protection while requiring minimal chip area.

SUMMARY OF THE INVENTION

For a CMOS integrated circuit in a package without bond wires, an electrostatic discharge (ESD) protect block may couple between an input/output (I/O) pad, to which a transmit circuit may couple, and an ESD clamp circuit coupled to ground. The ESD protect block, which may couple to the same I/O pad as the transmit circuit, may be implemented such that the load seen by the transmit circuit is low, thereby ensuring minimal distortion of the output signal. During transmission, one or more capacitors within the ESD protect block may charge up to various levels near the peak transmit voltage, which reverse biases one or more diodes in the ESD protect block, thereby buffering the transmit circuit from the capacitive load of the ESD clamp circuit. The ESD protect block may prevent the ESD clamp circuit from activating due to the high peak voltages output from the transmit circuit.

Several embodiments of the ESD protect block may apply to various transmit circuits in different CMOS processes using transistors operating at varying voltage levels. An embodiment of the ESD protect block may apply particularly to transmit power amplifier circuits in which the output signal peaks at twice the supply voltage. In one embodiment applicable for lower voltage CMOS processes, the ESD protect block comprises a diode and a capacitor. In another embodiment applicable for higher voltage CMOS processes, the ESD protect block comprises two diodes, one or two capacitors, and an optional resistor. The embodiments for an ESD protect block may require less die area than a conventional on-chip inductor.

DETAILED DESCRIPTION

Figure 1:
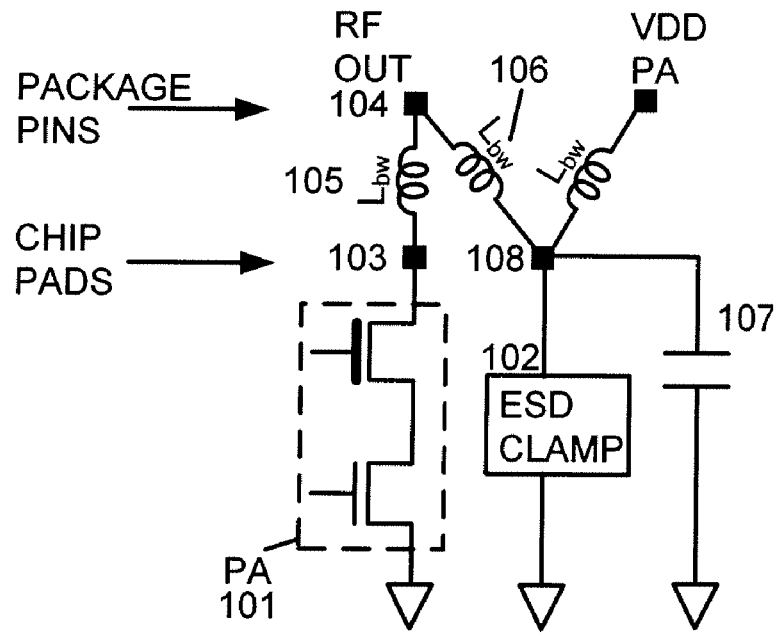
FIG. 1 illustrates a prior art ESD protection circuit for a CMOS power amplifier in a package with bond wires.
Figure 2:
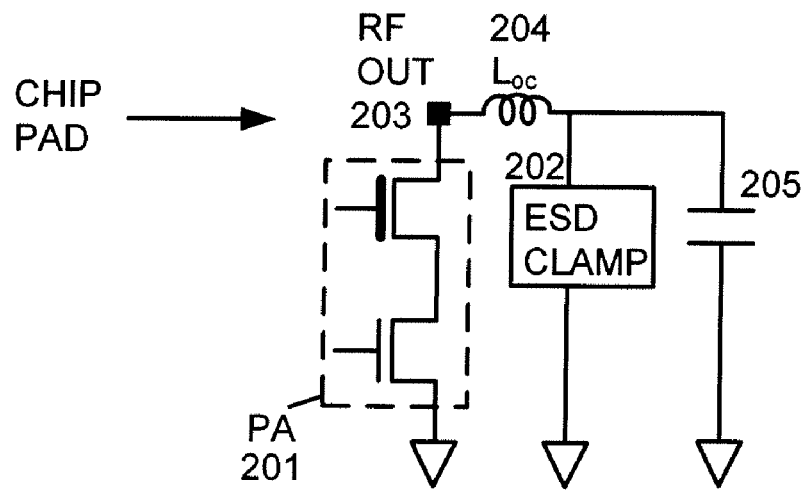
FIG. 2 illustrates a prior art ESD protection circuit using an on-chip inductor for a CMOS power amplifier in a package without bond wires.
Figure 3:
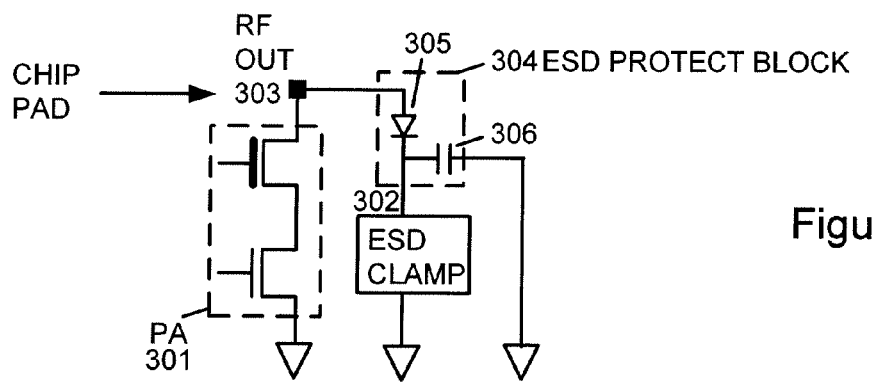
FIG. 3 illustrates an embodiment of the invention to provide ESD protection of a CMOS power amplifier in a package without bond wires using on-chip diodes and capacitors.

FIG. 3 illustrates one embodiment of an ESD protected integrated circuit 300 for a CMOS power amplifier (PA) 301 in a package without bond wires. A high voltage output signal from the PA 301 couples to an on chip pad 303 that couples to a package bump (not shown) without intervening bond wires. An ESD protect block 304, built from a diode 305 and a capacitor 306, couples between the chip pad 303 and an ESD clamp circuit 302, thereby protecting the ESD clamp circuit 302 from the high voltages generated by the PA 301, while simultaneously isolating the load of the ESD clamp circuit 302 from the PA 301.

When the PA 301 transmits an output signal, the voltage at the terminal of the capacitor 306 connected to a cathode of the diode 305 charges up to $V_{peak,1}-V_{diode,on}$; where $V_{peak,1}$ of the output signal from the PA 301 may typically reach twice the supply voltage used for the PA 301, and $V_{dode,on}$ equals approximately 0.7V. Once the capacitor 306 has charged up, the diode 305 operates in its reverse bias region as the voltage at an anode of the diode 305 remains below $V_{peak,1}$ most of the time. The capacitance of the diode 305 may typically be 100-200 femto-Farads while the capacitance of the capacitor 306 may typically be 1 pico-Farad. Both capacitances are small, and as such the diode 305 and the capacitor 306 present negligible loads to the PA 301 during transmission, and therefore the capacitances may not impact the PA 301 output signal's performance. Note that the PA 301 only sees the relatively small capacitance of the capacitor 306 while it's charging up, after which the PA 301 only sees the even smaller capacitance of the diode 305.

During an ESD event at the RF OUT pad 303, a low frequency current may flow from the RF OUT pad 303 through the diode 305 to the ESD clamp circuit 302 thereby protecting the PA 301 from the ESD. The voltage at the PA 301 output coupled to the RF OUT pad 303 may be higher during an ESD event than would occur in an ESD protected circuit without the diode 305 because of the forward bias voltage drop $V_{diode,on}$ across the diode 305 required to turn the diode 305 on; however, this higher voltage only affects ESD performance slightly and still provides adequate ESD protection of the PA 301. Both the ESD clamp circuit 302 and the capacitor 306 may be designed to ensure they do not incur damage from the voltage $V_{peak,1}-V_{diode,on}$ present at their terminals during normal operation.

Figure 4:
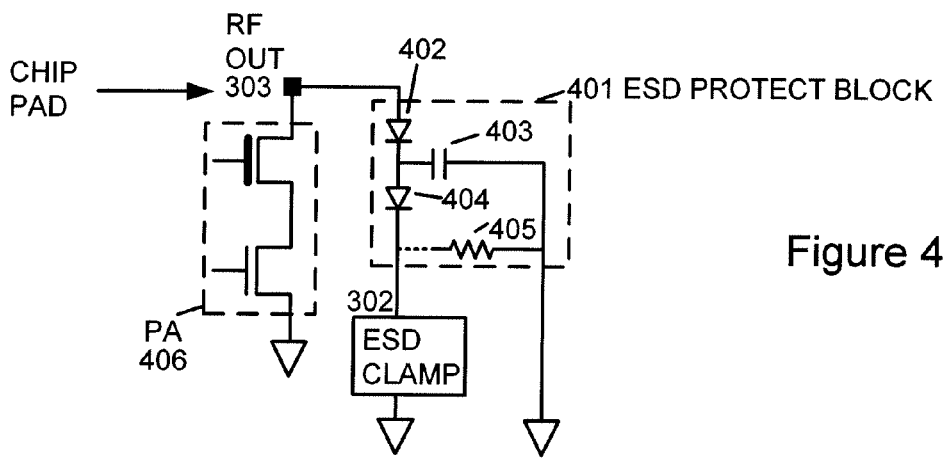
FIG. 4 illustrates another embodiment of the invention to provide ESD protection of a CMOS power amplifier that may use higher voltages than FIG. 3.

FIG. 4 illustrates an alternative embodiment of an ESD protected integrated circuit 400 using an ESD protect block 401 with a PA 406 that may produce higher output signal voltages than the PA 301 of FIG. 3. The peak voltage $V_{peak,2}$ from the PA 406 at the RF OUT chip pad 303 in FIG. 4 may be reduced by the forward bias voltage drop $2V_{diode,on}$ of the cascade of two diodes 402 and 404 in the ESD protect block 401 to a level that may not damage the ESD claim circuit 302. The voltage at a cathode of diode 402 may reach $V_{peak,2}-V_{diode,on}$ during PA 406 operation, while the voltage at a cathode of diode 404, which couples to the ESD clamp circuit 302, may reach only the lower value $V_{peak,2}-2V_{diode,on}$. A capacitor 403 coupled to the cathode of diode 402 may be designed so that the ESD protect block 401 withstands the higher voltage $V_{peak,2}-V_{diode,on}$ during PA 406 operation, but such a capacitor may require a larger die area than the capacitor 306 in FIG. 3. An optional resistor 405, chosen sufficiently large to load minimally the PA 406 during transmission, may be coupled to the cathode of diode 404, thereby ensuring a small leakage current flows through diodes 402 and 404, and thus a significant voltage drop exists across them. The resistor 405 may require an in-series power-down control to minimize power consumption when the PA 406 is powered down.

Figure 5:
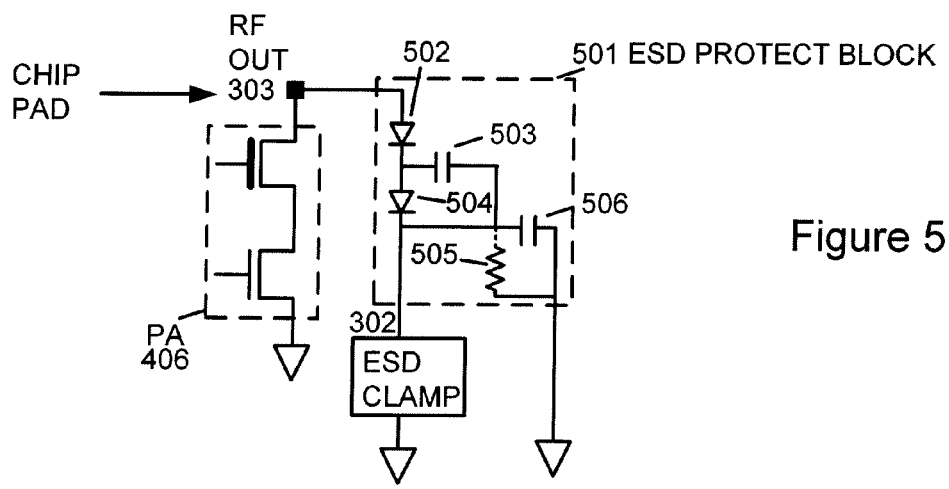
FIG. 5 illustrates a variant embodiment of the invention to provide ESD protection of a CMOS power amplifier incorporating additional components.

FIG. 5 illustrates another embodiment of an ESD protected integrated circuit 500 using an ESD protect block 501 comprising two cascaded diodes 502 and 504 and two cascaded capacitors 503 and 506. The die area of the two capacitors 503 and 506 may be smaller than the die area of the individual capacitor 403 used in the ESD protect block 401 of FIG. 4 because each capacitor in the ESD protect block 501 may see a lower voltage across themselves. When the capacitor 506 charges fully to $V_{peak,2}-2V_{diode,on}$ during PA 406 operation, the capacitor 503 only sees the smaller voltage $V_{diode,on}$ across its terminals. A optional resistor 505 may be coupled to a cathode of diode 504 in the ESD protect block 501 to ensure a small leakage current through diodes 502 and 504 resulting in a minimum voltage drop of $V_{diode,on}$ across each diode. The resistor 505 may require in-series power-down control to minimize power consumption when the PA 406 is powered down.

While the embodiments described above describe an ESD protected integrated circuit including a power amplifier, an embodiment of the invention, more generically, may provide ESD protection for any transmit circuit that generates transmit signals higher than the supply voltage.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. Accordingly, it is intended that the scope of the invention be defined by the following Claims and their equivalents.

The invention claimed is:

1. An electrostatic discharge (ESD) protected integrated circuit comprising:
   a transmit circuit having an output coupled to an integrated circuit pad;
   an ESD protect block; and
   an ESD clamp circuit;
   wherein a first terminal of the ESD protect block couples to the integrated circuit pad, and a second terminal of the ESD protect block couples to a first terminal of the ESD clamp circuit, and a second terminal of the ESD clamp circuit couples to ground, and a third terminal of the ESD protect block couples to ground; and
   wherein the ESD protect block includes one or more diodes coupled between the first and second terminals, and
   wherein the ESD protect block comprises:
      a first diode, wherein an anode of the first diode couples to the first terminal of the ESD protect block, and a cathode of the first diode couples to the second terminal of the ESD protect block; and
      a first capacitor, wherein a first terminal of the first capacitor couples to the second terminal of the ESD protect block, and a second terminal of the first capacitor couples to the third terminal of the ESD protect block.

2. The apparatus of claim 1 wherein the transmit circuit includes a power amplifier circuit.

3. An electrostatic discharge (ESD) protected integrated circuit comprising:
   a transmit circuit having an output coupled to an integrated circuit pad;
   an ESD protect block; and
   an ESD clamp circuit;

wherein a first terminal of the ESD protect block couples to the integrated circuit pad, and a second terminal of the ESD protect block couples to a first terminal of the ESD clamp circuit, and a second terminal of the ESD clamp circuit couples to ground, and a third terminal of the ESD protect block couples to ground; and wherein the ESD protect block includes one or more diodes coupled between the first and second terminals, and wherein the ESD protect block comprises:
- a first diode and a second diode, wherein an anode of the first diode couples to the first terminal of the ESD protect block, and a cathode of the first diode couples to an anode of the second diode, and a cathode of the second diode couples to the second terminal of the ESD protect block; and
- a first capacitor, wherein a first terminal of the first capacitor couples to the cathode of the first diode, and a second terminal of the first capacitor couples to the third terminal of the ESD protect block.

4. The apparatus of claim 3 wherein the transmit circuit includes a power amplifier circuit.

5. The apparatus of claim 3 further comprising:
a resistor wherein a first terminal of the resistor couples to the second terminal of the ESD protect block, and a second terminal of the resistor couples to ground.

6. The apparatus of claim 5 wherein the transmit circuit includes a power amplifier circuit.

7. An electrostatic discharge (ESD) protected integrated circuit comprising:
- a transmit circuit having an output coupled to an integrated circuit pad;
- an ESD protect block; and
- an ESD clamp circuit;

wherein a first terminal of the ESD protect block couples to the integrated circuit pad, and a second terminal of the ESD protect block couples to a first terminal of the ESD clamp circuit, and a second terminal of the ESD clamp circuit couples to ground, and a third terminal of the ESD protect block couples to ground; and wherein the ESD protect block includes one or more diodes coupled between the first and second terminals, and wherein the ESD protect block comprises:
- a first diode and a second diode, wherein an anode of the first diode couples to the first terminal of the ESD protect block, and a cathode of the first diode couples to an anode of the second diode, and a cathode of the second diode couples to the second terminal of the ESD protect block; and
- a first capacitor and a second capacitor, wherein the first terminal of the first capacitor couples to the cathode of the first diode, and a second terminal of the first capacitor couples to the second terminal of the ESD protect block, and a first terminal of the second capacitor couples to the second terminal of the first capacitor, and a second terminal of the second capacitor couples to the third terminal of the ESD protect block.

8. The apparatus of claim 7 wherein the transmit circuit includes a power amplifier circuit.

9. The apparatus of claim 7 further comprising:
a resistor wherein a first terminal of the resistor couples to the second terminal of the ESD protect block, and a second terminal of the resistor couples to ground.

10. The apparatus of claim 9 wherein the transmit circuit includes a power amplifier circuit.

* * * * *

UNITED STATES PATENT AND TRADEMARK OFFICE
CERTIFICATE OF CORRECTION

| | |
|---|---|
| PATENT NO. | : 7,787,227 B1 |
| APPLICATION NO. | : 12/109240 |
| DATED | : August 31, 2010 |
| INVENTOR(S) | : Manolis Terrovitis |

Page 1 of 1

It is certified that error appears in the above-identified patent and that said Letters Patent is hereby corrected as shown below:

On the title page item (75), change

"Terrovits" to -- Terrovitis --.

Signed and Sealed this

Fifth Day of October, 2010

David J. Kappos
*Director of the United States Patent and Trademark Office*